(12) United States Patent
Liu

(10) Patent No.: US 8,279,688 B2
(45) Date of Patent: Oct. 2, 2012

(54) SENSE AMPLIFIER ENABLE SIGNAL GENERATION

(75) Inventor: Jack Liu, Taipei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 254 days.

(21) Appl. No.: 12/843,556

(22) Filed: Jul. 26, 2010

(65) Prior Publication Data

US 2012/0020173 A1    Jan. 26, 2012

(51) Int. Cl.
*G11C 7/00* (2006.01)

(52) U.S. Cl. .................................... 365/194; 365/233.5

(58) Field of Classification Search ............... 365/194, 365/233.5
See application file for complete search history.

(56) References Cited

U.S. PATENT DOCUMENTS

| 5,940,606 | A  | * | 8/1999 | Ghia et al. | 713/500 |
| 6,230,245 | B1 | * | 5/2001 | Manning | 711/167 |
| 2009/0140711 | A1 | * | 6/2009 | Philbrick et al. | 323/285 |

* cited by examiner

*Primary Examiner* — Michael Tran
(74) *Attorney, Agent, or Firm* — Slater & Matsil, L.L.P.

(57) ABSTRACT

System and method for generating a sense amplifier enable ("SAE") signal having a programmable delay with a feedback loop to control the SAE signal duty cycle, which can be used in SRAM or DRAM, or other kinds of memory cells. An illustrative non-limiting embodiment comprises: a programmable clock chopper, a low pass filter, a bias generator, a comparator, and a feedback control module.

20 Claims, 7 Drawing Sheets

SENSE AMPLIFIER ENABLE SIGNAL GENERATION

TECHNICAL FIELD

The present disclosure relates generally to an apparatus and a method for semiconductor memory device, and more particularly to generating a sense amplifier enable ("SAE") signal having a programmable delay.

BACKGROUND

Many types of memory devices such as Dynamic Random Access Memory ("DRAM") or Static Random Access Memory ("SRAM") devices store information in memory cells arranged as an array of selectable rows and columns. Lines connecting each row are commonly referred to as word lines ("WL"). Each column typically comprises a bit line and its complement. Word lines are activated to select the desired memory cell for memory operations. Data stored by each memory cell is transferred to a sense amplifier ("SA") circuitry via the bit lines for amplification.

A sense amplifier is driven by an enable signal that is generated from a sense amplifier enable ("SAE") signal generator. The SAE signal generator typically receives an external clock signal applied from an external source and generates a SAE signal.

To perform a sensing operation after an address is applied from an external source, data stored in a memory cell (a bit cell) drives a pair of bit lines up to a predetermined level. The SAE signal is activated. The SAE signal generator typically is configured so as to receive the external clock signal and then activate the SAE signal after a delay of a predetermined period of time instead of a programmable delay.

A conventional self-timed approach for SAE signal generator generates a SAE signal from the rising edge of a clock signal. The pulse width of both WL and SAE are determined by internal self-resetting path, which is highly sensitive to processing, voltage, and temperature ("PVT") variations. Furthermore, inaccurate models can cause frequency independent failures.

Another conventional clock based approach generates the signal WL during the entire clock high phase. At the clock signal falling edge, the SAE signal is generated by the SAE signal generator. Since during this clock cycle, the WL and SAE are both active, the bit lines will need to be pre-charged at an additional clock cycle, thus using another clock cycle for each read operation, resulting in low throughput. At the same time, the WL pulse may be too long at lower clock frequency, and this wastes power.

Therefore, a solution is needed to generate SAE signals to eliminate the additional clock cycle used in the conventional clock based approach, to increase the throughput. A solution is also needed to eliminate the internal self-resetting path in the conventional self-timed approach so that the resulting SAE signal can be more tolerant to PVT variations, which has become increasingly difficult with increased PVT variations in advanced semiconductor processes.

SUMMARY

These and other problems are generally solved or circumvented, and technical advantages are generally achieved, by illustrative embodiments, which provide an apparatus, a system, and a method for generating a sense amplifier enable ("SAE") signal having a programmable delay.

In an exemplary embodiment of a sense amplifier enable signal generator, an illustrative apparatus is provided including a programmable clock chopper, a low pass filter, a bias generator, a comparator, and a feedback control module. The programmable clock chopper receives an input clock signal and a delay factor signal and generates a sense amplifier enable signal. The low pass filter receives the sense amplifier enable signal and generates a first voltage. The bias generator generates a reference voltage corresponding to a duty cycle factor. The comparator compares the reference voltage and the first voltage generated by the low-pass filter, and generates a comparison result, which is used by the control module to determine the delay factor for the programmable clock chopper.

In an exemplary embodiment of a sense amplifier enable signal generator, an illustrative method is provided for generating a sense amplifier enable signal. The method generates a sense amplifier enable signal by programming a programmable clock chopper coupled to an input clock signal and a delay factor signal. Then low pass filtering is performed on the sense amplifier enable signal to generate a first voltage. The first voltage is compared by a comparator to a reference voltage corresponding to a duty cycle factor. Finally the comparison result is used by a feedback control module to selectively perform incrementing or decrementing a programmable delay element of the programmable clock chopper by the delay factor.

In an exemplary embodiment of a sense amplifier enable signal generator, an illustrative system is provided including a plurality of memory cells and at least one sense amplifier controlled by a sense amplifier enable signal generated by a sense amplifier enable signal generator. The memory cells are connected to bit lines and complement bit lines. The sense amplifier receives one of the bit line signal and its complement signal and generates an output. The sense amplifier enable signal generator further comprises a programmable clock chopper, a low pass filter, a bias generator, a comparator, and a control module.

The exemplary embodiments of apparatus, method, and system can generate SAE signals without using an additional clock cycle as used in the conventional clock based approach, resulting in increased throughput. The exemplary embodiments of apparatus, method, and system have programmable delay and eliminate the internal self-resetting path used in the conventional self-timed approach so that the resulting SAE signal can be more tolerant to PVT variations.

BRIEF DESCRIPTION OF THE DRAWINGS

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Illustrative embodiments will be discussed with respect to a feedback controlled SAE signal generator used to generate an SAE signal to control the operation of sense amplifiers used in memory such as DRAM and SRAM. Other embodiments contemplate use in other circumstances that require sense amplifiers, including non-volatile memory cells such as flash memory and register files in a central processing unit ("CPU").

Figure 1:
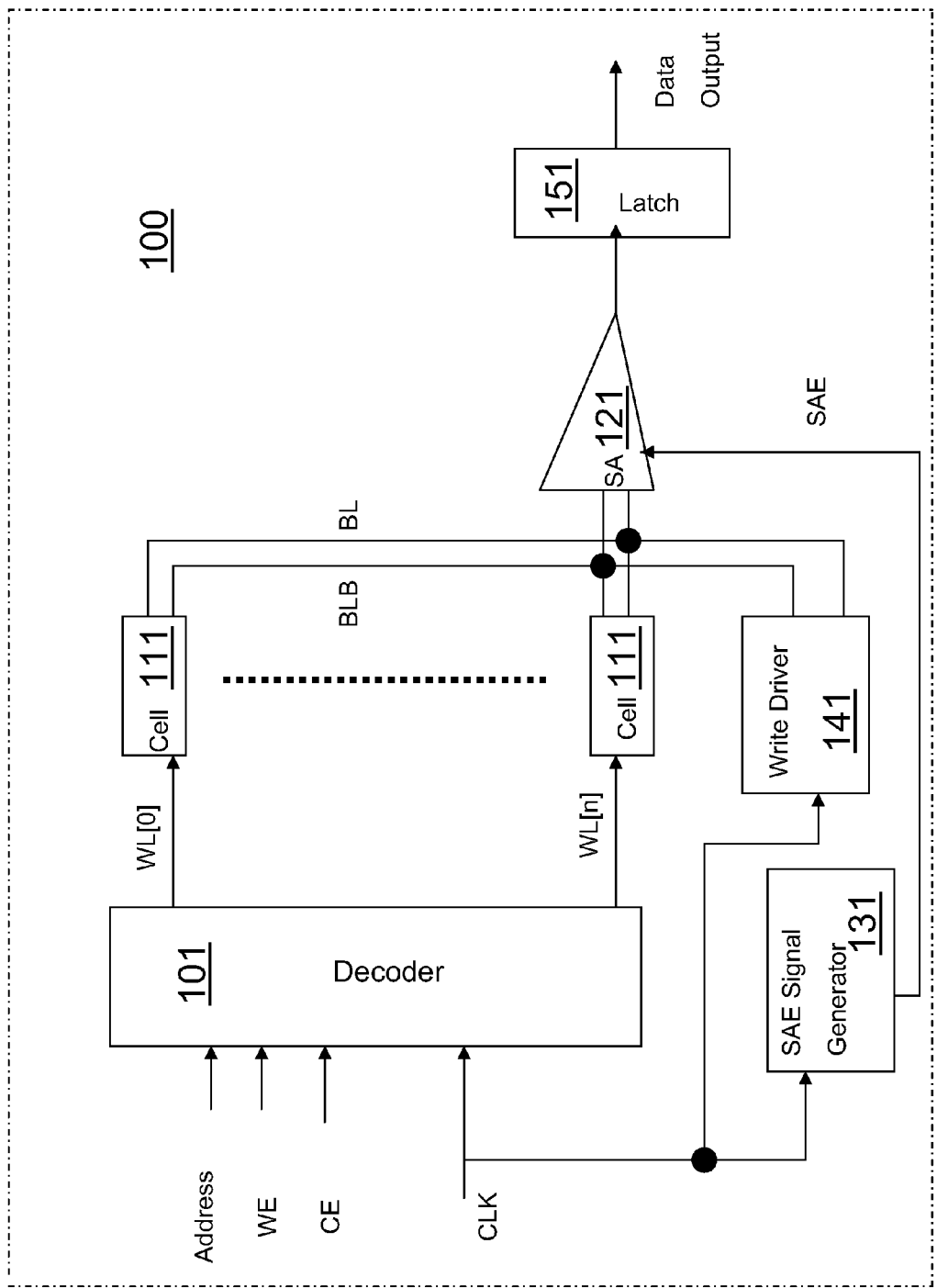
FIG. 1 depicts a block diagram of an illustrative embodiment of a SAE Signal Generator embedded within a SRAM memory structure.

FIG. 1 illustrates a block diagram of an illustrative embodiment of a SAE Signal Generator 131 embedded within a SRAM memory structure 100. A plurality of memory cells 111 are arranged in rows and columns. Word lines WL[0] to WL[n] are connected to each row. Bit lines BL and complement bit lines BLB are the data carrying lines, and are typically arranged in columns. A sense amplifier ("SA") 121 is coupled to the bit lines BL and BLB. At the beginning of the memory cycle operation, the SA 121 is disabled and the bit lines BL and BLB are pre-charged to a matching intermediary voltage level by the Writer Driver circuit 141. The bit line BL and BLB pre-charging is then disabled. When a row address is received, a row decoding operation is performed by the Decoder 101 to decode the row address received to select a corresponding one of word lines WL of a cell array block. An active signal, typically a high voltage, is placed on the selected word line WL. Then data from cells connected to the selected word line WL are transferred to bit lines BL and BLB. At this time, the SAE Signal Generator 131 is activated to generate a SAE signal, which enables the SA 121 to begin a sensing operation. In operation, a voltage difference between the bit lines BL and BLB is sensed by SA 121 and changed from a very small differential voltage to a large voltage, stored in a Latch 151, and output as data.

Figure 2:
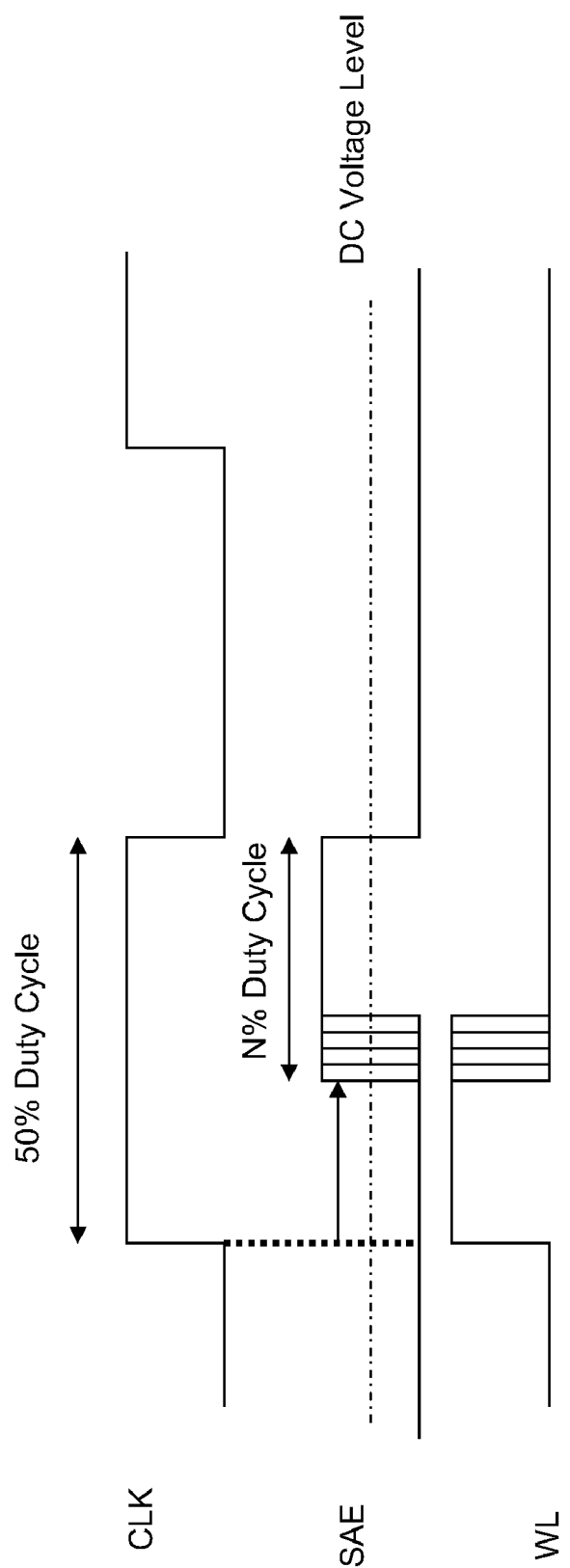
FIG. 2 depicts timing diagrams of the clock signal CLK, the SAE signal generated by an illustrative embodiment of the SAE Signal Generator, and the WL signal of a memory block.

FIG. 2 are timing diagrams of the clock signal CLK, the SAE signal generated by an illustrative embodiment of the SAE Signal Generator, and the WL signal of a memory block. The clock signal has an equal width of the clock high phase and the clock low phase, therefore the clock has a 50% clock duty cycle. The illustrative embodiment of the SAE Signal Generator can generate a SAE signal whose high phase is a programmable N % duty cycle of the clock signal, where N % is less than 50%. At the same time, the WL signal high phase has a duty cycle of (50-N) % duty cycle. The reduction of the duty cycle of SAE signal and the WL signal is done by a programmable clock chopper. A selectable DC voltage is used to calibrate, determine, and set the duty cycle of the SAE signal and the WL signal. WL signal high phase has no overlap with the SAE signal high phase so that the summation of both WL signal and SAE signal duty cycles is equal to 50%.

Figure 3:
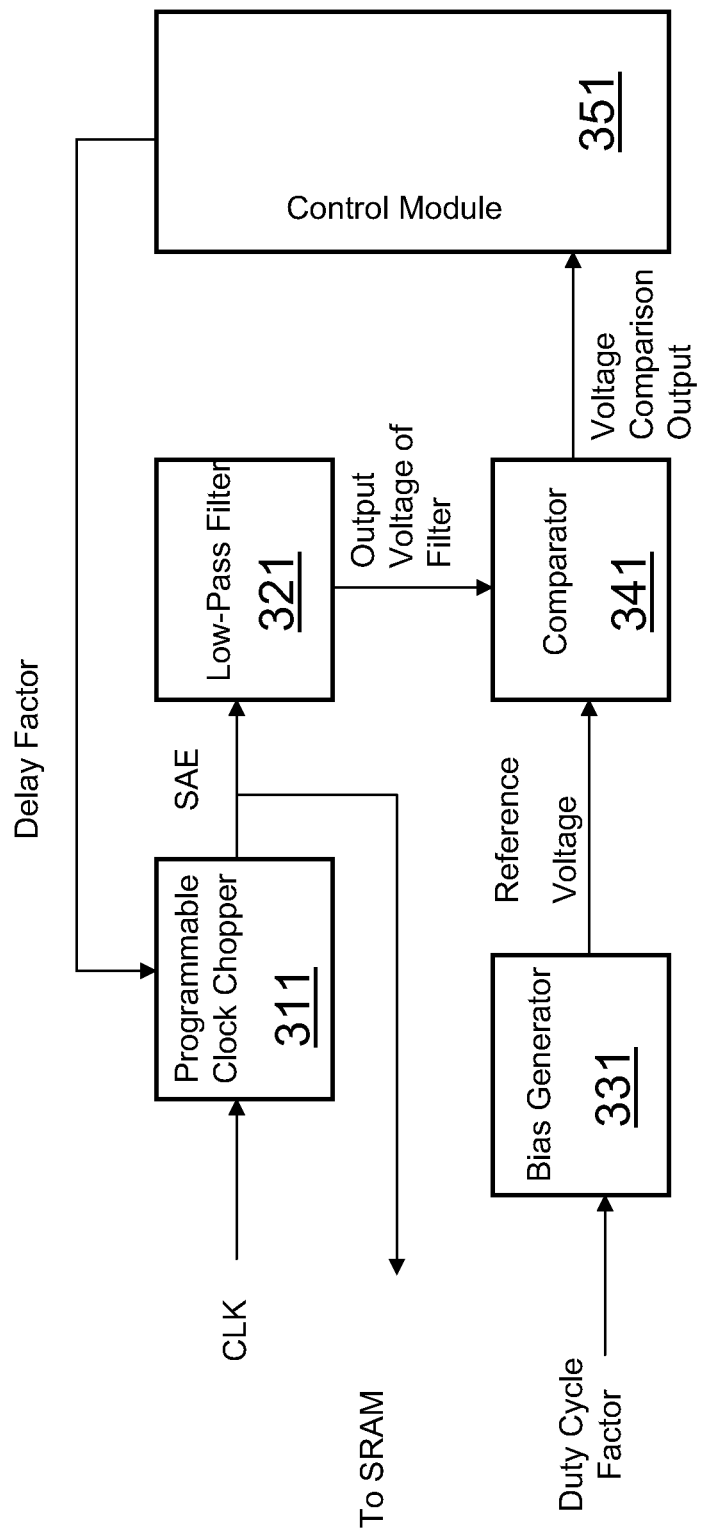
FIG. 3 depicts an illustrative embodiment of an apparatus for a SAE Signal Generator.

FIG. 3 is an illustrative embodiment of an apparatus 300 for a SAE Signal Generator 131 in FIG. 1. The selected components of the SAE Signal Generator apparatus are a Programmable Clock Chopper 311, a Low-Pass Filter 321, a Bias Generator 331, a Comparator 341, a Control Module 351, an input clock signal CLK, an input signal specifying the Duty Cycle Factor, and an output signal which is the SAE signal. The configuration shown is an example configuration and it is non-limiting. Signals and components can be physically configured in different ways. Those of ordinary skill in the art will appreciate that the configuration of the illustrative features within an embodiment may be varied.

In FIG. 3, an illustrative embodiment of the Programmable Clock Chopper 311 is configured to receive an input clock signal CLK and a Delay Factor signal, and to generate a SAE signal which is used to control an illustrative sense amplifier such as the SA 121 in FIG. 1. The Low Pass Filter 321 is configured to receive the SAE signal, and to generate a first voltage corresponding to the duty cycle of the SAE signal. The Bias Generator 331 is configured to generate a reference voltage corresponding to the user specified Duty Cycle Factor. The Comparator 341 is configured to receive the reference voltage and the first voltage and generate a comparison result. The Control Module 351 is configured to receive the comparison result, and generate the Delay Factor signal for the Programmable Clock Chopper. This Delay Factor signal sets the N % duty cycle for the SAE signal. Thus the circuit controls the duty cycle for the SAE signal using a feedback control loop.

Figure 5:
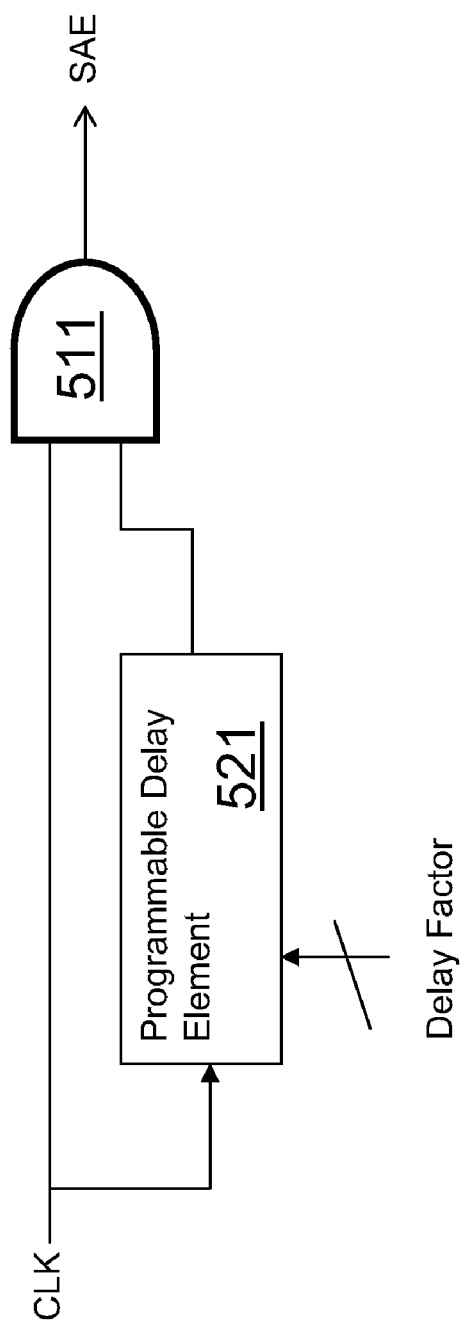
FIG. 5 depicts an illustrative embodiment of the Programmable Clock Chopper.

In FIG. 5, an illustrative embodiment of the Programmable Clock Chopper 500 is shown. The components of the Programmable Clock Chopper are a Programmable Delay Element 521 and a logic AND gate 511. The AND gate may be other logic elements, such as NAND, NOR, etc., as long as the element combines the two waveforms correctly. The Programmable Delay Element 521 is coupled to an input clock signal CLK and a Delay Factor signal configured to generate a delayed clock output; and the AND gate is coupled to the input clock signal and the delayed clock output to generate the output for the Programmable Clock Chopper. The Programmable Delay Element can be either a digital delay element or an analog delay element. In operation, the rising edge of the SAE signal will follow the rising edge of clock CLK by a time delay determined by the Programmable Delay Element. The falling edge of the SAE signal is determined by the falling edge of CLK.

Figure 6:
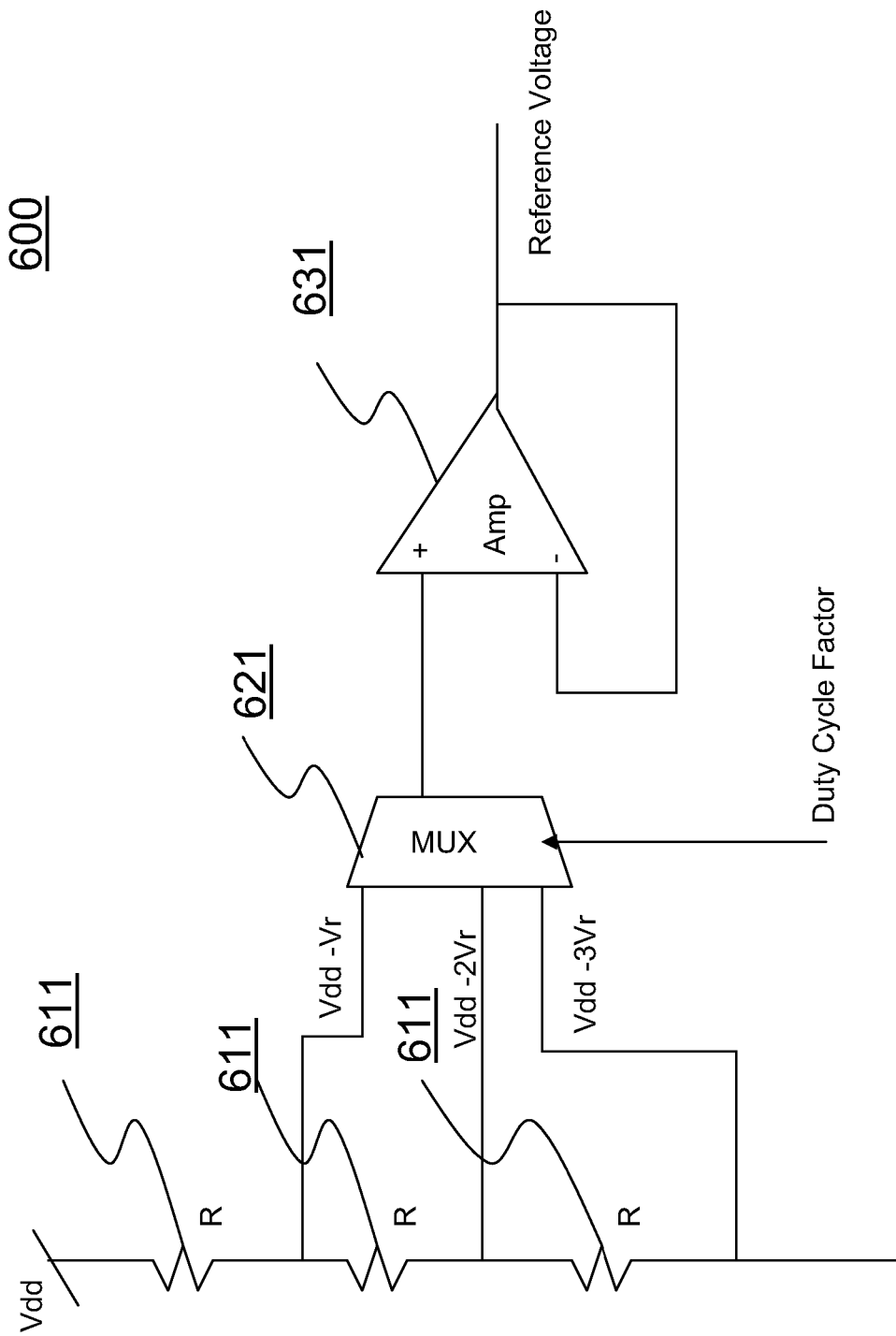
FIG. 6 depicts an illustrative embodiment of the Bias Generator.

In FIG. 6, an illustrative embodiment of the Bias Generator 600 is shown and the selected components of the bias generator are: a plurality of Resistor elements 611, a Multiplexer 621, and an Amplifier 631. The plurality of Resistor elements 611 are coupled to the Multiplexer 621 to select an input voltage from a Resistor element as an output of the Multiplexer; and the Amplifier 631 is coupled to the output of the Multiplexer and a feedback input from the Amplifier. The output is a Reference Voltage corresponding to the Duty Cycle Factor.

Figure 7:
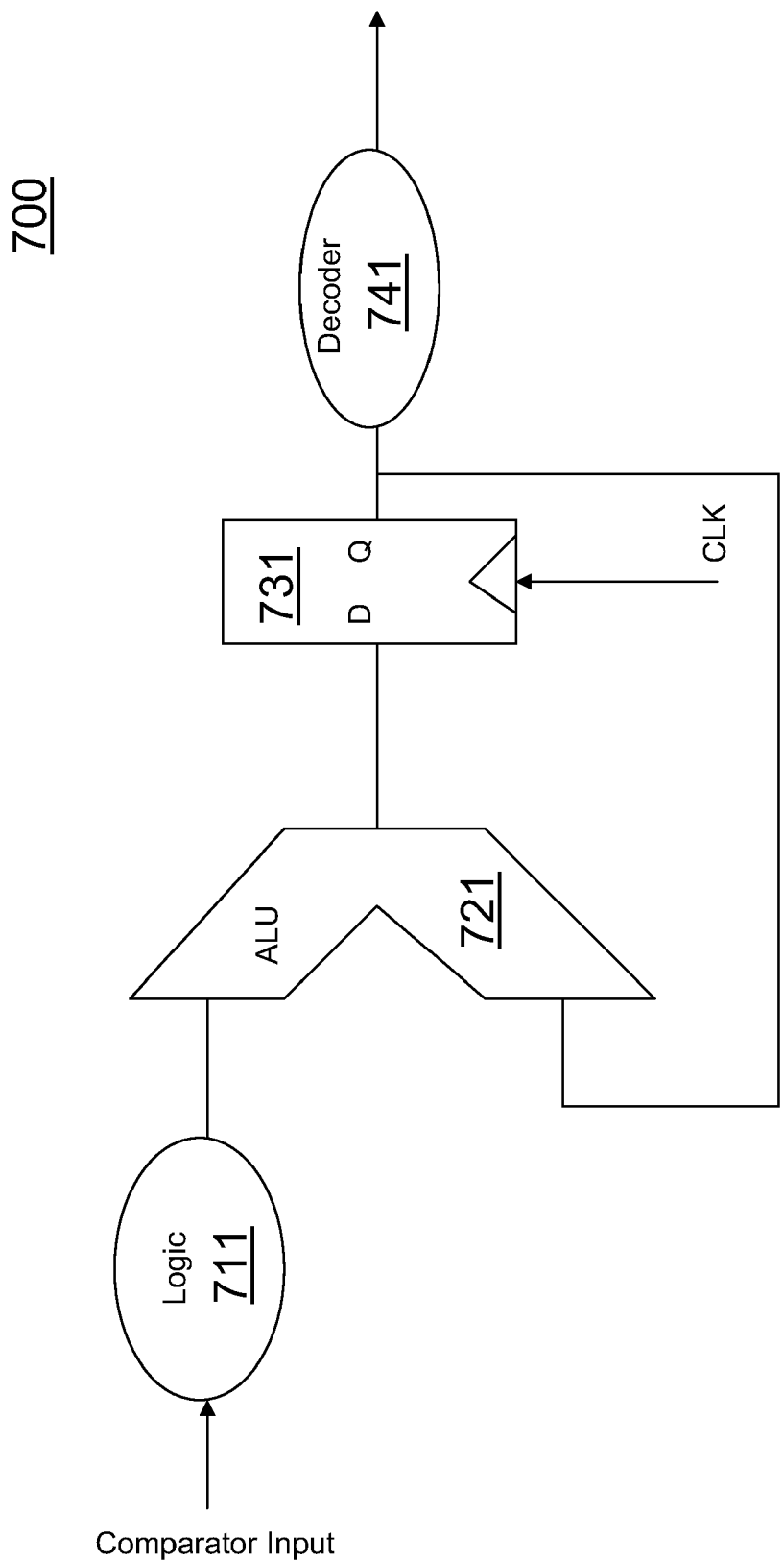
FIG. 7 depicts an illustrative embodiment of the Control Module.

The Control Module can be implemented by digital components or analog components. In FIG. 7, an illustrative embodiment of the Control Module 700 is shown and the selected components of the bias generator are: a Logic element 711, an Arithmetic Logic Unit ("ALU") 721, a flip-flop 731, and a Decoder 741. The Logic element generates a logic output; the ALU 721 receives the Logic element output and a feedback signal from the flip-flop 731. The flip-flop 731 receives the ALU output and generates an output to feed the ALU as a feedback input. The Decoder 741 receives the flip-flop output and generates the output for the Control Module, which is the Delay Factor used to program the Programmable Clock Chopper illustrated in FIG. 5 and used in an illustrative embodiment in component 311. In alternative embodiments, the Control Module may incorporate analog circuitry such as analog to digital converter ("ADC").

Figure 4:
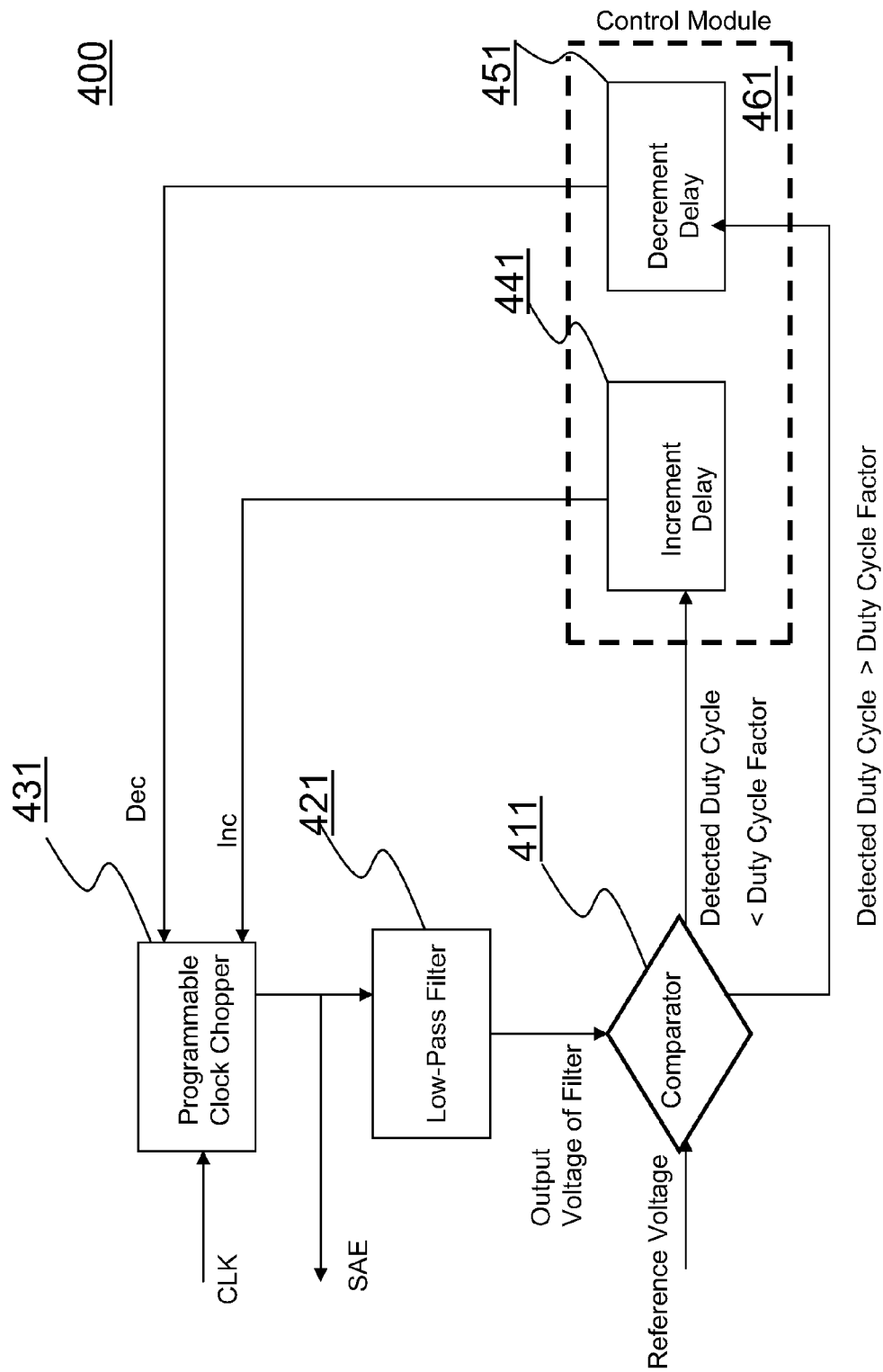
FIG. 4 depicts a flow chart of an illustrative method embodiment for generating a SAE signal.

FIG. 4 is a flow chart 400 of an illustrative method embodiment for generating a SAE signal. The SAE signal is generated by programming a programmable delay element of a Programmable Clock Chopper 431 upon receiving an input clock signal CLK and a delay factor to be decremented or incremented. The delay factor is determined by a Control Module to selectively perform one of Incrementing 441 and Decrementing 451 the programmable delay element of the Programmable Clock Chopper. The incrementing or decrementing is determined based on a comparison result 411 from comparing two voltages, the first voltage generated by a Low Pass Filter 421 upon receiving the SAE signal and the second voltage is a Reference Voltage specified by a duty cycle factor. If the Comparator finds the voltage corresponding to the duty cycle from the Low Pass Filter is smaller than the specified duty cycle factor indicated by the Reference Voltage, the Control Module 461 will increment the programmable delay by a delay factor. If the Comparator finds the voltage corresponding to the duty cycle from the Low Pass Filter is larger than the specified duty cycle factor indicated by the Reference Voltage, the Control Module 461 will decrement the programmable delay of the Programmable Clock Chopper by a delay factor. By setting the Reference Voltage, a user may determine the N % duty cycle to the SAE signal. The feedback control loop automatically adjusts the delay cycle of the SAE signal. Changes on temperature, power, etc. that would otherwise affect the SAE signal duty cycle are therefore compensated for.

Although the present embodiments and their advantages have been described in detail, it should be understood that various changes, substitutions and alterations can be made herein without departing from the spirit and scope of the disclosure as defined by the appended claims. For example, many of the features and functions discussed above can be implemented in software, hardware, or firmware, or a combination thereof. As another example, it will be readily understood by those skilled in the art that may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a programmable clock chopper configured to receive an input clock signal and a delay factor signal and configured to generate a sense amplifier enable signal;
a low pass filter configured to receive the sense amplifier enable signal, and configured to generate a first voltage;
a bias generator configured to generate a reference voltage;
a comparator configured to receive the reference voltage and the first voltage, configured to generate a comparison result; and
a control module configured to receive the comparison result, and configured to generate the delay factor signal for the programmable clock chopper.

2. The apparatus of claim 1, wherein the programmable clock chopper further comprises:
a programmable delay element coupled to the input clock signal and the delay factor signal configured to generate a delayed clock output; and
a logic element coupled to the input clock signal and the delayed clock output configured to generate the sense amplifier enable signal.

3. The apparatus of claim 2, wherein the programmable delay element is a digital delay element.

4. The apparatus of claim 2, wherein the programmable delay element is an analog delay element.

5. The apparatus of claim 1, wherein the bias generator further comprises:
a plurality of resistor elements coupled to a multiplexer to select an input voltage from a resistor element as an output of the multiplexer; and
an amplifier coupled to the output of the multiplexer configured to generate the reference voltage.

6. The apparatus of claim 1, wherein the control module further comprises:
a logic element generating a logic output from the comparator;
an Arithmetic Logic Unit (ALU) receiving the logic element output;
a flip-flop receiving as input the ALU output and configured to generate an output to feed the ALU as a feedback input; and
a decoder receiving the flip-flop output and configured to generate the delay factor signal for the programmable clock chopper.

7. The apparatus of claim 1, wherein the apparatus forms a feedback loop to control the sense amplifier enable signal duty cycle.

8. A method for generating a sense amplifier enable signal comprising:
generating a sense amplifier enable signal by programming a programmable clock chopper coupled to an input clock signal and a delay factor signal;
generating a first voltage by performing low pass filtering on the sense amplifier enable signal;
comparing the first voltage and a reference voltage corresponding to a selected duty cycle factor; and
selectively performing one of incrementing and decrementing a programmable delay element of the programmable clock chopper by the delay factor, resulting from the comparing.

9. The method of claim 8, wherein generating the sense amplifier enable signal by the programmable clock chopper further comprises:
generating a delayed clock output by a programmable delay element of the programmable clock chopper coupled to the input clock signal; and
generating the sense amplifier enable signal by logically conditioning the input clock signal and the delayed clock output.

10. The method of claim 9, wherein generating the sense amplifier enable signal by the programmable clock chopper further comprises:

generating the delayed clock output by operating a digital programmable delay element coupled to the input clock signal.

11. The method of claim 9, wherein generating the sense amplifier enable signal by the programmable clock chopper further comprises:
generating the delayed clock output by operating an analog programmable delay element coupled to the input clock signal.

12. The method of claim 8, wherein selectively performing one of incrementing and decrementing the programmable delay element of the programmable clock chopper by the delay factor further comprises:
generating a logic output by a logic element coupled to the comparing result;
receiving the logic output by an Arithmetic Logic Unit (ALU) and generating an ALU output;
receiving the ALU output by a flip-flop and generating a flip-flop output to the ALU as a feedback input; and
receiving the flip-flop output by a decoder and generating the delay factor output.

13. A system comprising:
a plurality of memory cells coupled to bit lines and complement bit lines;
at least one sense amplifier controlled by a sense amplifier enable signal, receiving one of the bit line signal and its complement signal, and generating an output; and
a sense amplifier enable signal generator generating the sense amplifier enable signal; wherein the sense amplifier enable signal generator further comprises:
a programmable clock chopper configured to receive an input clock signal and a delay factor signal, configured to generate the sense amplifier enable signal;
a low pass filter configured to receive the sense amplifier enable signal, configured to generate a first voltage corresponding to the duty cycle of the sense amplifier enable signal;
a bias generator configured to generate a reference voltage;
a comparator configured to receive the reference voltage and the first voltage, configured to generate a comparison result; and
a control module configured to receive the comparison result, and configured to generate the delay factor signal for the programmable clock chopper.

14. The system of claim 13, wherein the programmable clock chopper further comprises:
a programmable delay element coupled to the input clock signal and the delay factor signal configured to generate a delayed clock output; and
a logic function coupled to the input clock signal and the delayed clock output, generating the sense amplifier enable signal.

15. The system of claim 14, wherein the programmable delay element is a digital delay element.

16. The system of claim 14, wherein the programmable delay element is an analog delay element.

17. The system of claim 13, wherein the bias generator further comprises:
a plurality of resistor elements coupled to a multiplexer to select an input from a resistor element as an output of the multiplexer; and
an amplifier coupled to the output of the multiplexer and a feedback input from the amplifier and generating the reference voltage.

18. The system of claim 13, wherein the control module further comprises:
a logic element generating a logic output coupled to the comparison result;
an Arithmetic Logic Unit (ALU) receiving an input from the logic element output;
a flip-flop receiving an input from the ALU output and generating an output to feed the ALU as a feedback input; and
a decoder receiving as input from the flip-flop output and generating the delay factor.

19. The system of claim 13, wherein the memory cells are SRAM memory cells.

20. The system of claim 13, wherein the memory cells are DRAM memory cells.

* * * * *